(12) United States Patent
Bovo et al.

(10) Patent No.: US 11,043,645 B2
(45) Date of Patent: Jun. 22, 2021

(54) ORGANIC PHOTODETECTOR

(71) Applicant: Sumitomo Chemical Company Limited, Tokyo (JP)

(72) Inventors: Gianluca Bovo, Godmanchester (GB); Matthew Roberts, Godmanchester (GB); Nir Yaacobi-Gross, Godmanchester (GB)

(73) Assignee: Sumitomo Chemical Company Limited, Tokyo (JP)

(*) Notice: Subject to any disclaimer, the term of this patent is extended or adjusted under 35 U.S.C. 154(b) by 142 days.

(21) Appl. No.: 16/336,827

(22) PCT Filed: Sep. 25, 2017

(86) PCT No.: PCT/GB2017/052856
§ 371 (c)(1),
(2) Date: Mar. 26, 2019

(87) PCT Pub. No.: WO2018/055408
PCT Pub. Date: Mar. 29, 2018

(65) Prior Publication Data
US 2020/0381644 A1    Dec. 3, 2020

(30) Foreign Application Priority Data

Sep. 26, 2016 (GB) ..................... 1616300

(51) Int. Cl.
*H01L 51/42* (2006.01)
*H01L 51/00* (2006.01)

(52) U.S. Cl.
CPC ...... *H01L 51/4253* (2013.01); *H01L 51/0007* (2013.01); *H01L 51/0047* (2013.01)

(58) Field of Classification Search
CPC ............. H01L 51/4253; H01L 51/0043; H01L 51/0036; H01L 51/0032; C08G 61/126
See application file for complete search history.

(56) References Cited

U.S. PATENT DOCUMENTS

| | | |
|---|---|---|
| 2013/0153032 A1 | 6/2013 | Forrest et al. |
| 2014/0001455 A1 | 1/2014 | Holmes et al. |
| 2016/0267337 A1 | 9/2016 | Bofinger et al. |

FOREIGN PATENT DOCUMENTS

| | | |
|---|---|---|
| WO | WO 2013/159862 A1 | 10/2013 |
| WO | WO 2014/202184 A1 | 12/2014 |
| WO | WO 2015/067336 A1 | 5/2015 |
| WO | WO 2015/192942 A1 | 12/2015 |
| WO | WO 2016/034261 A1 | 3/2016 |

(Continued)

OTHER PUBLICATIONS

PCT/GB2017/052856, Dec. 1, 2017, International Search Report and Written Opinion.

(Continued)

*Primary Examiner* — Anthony Ho
(74) *Attorney, Agent, or Firm* — Wolf, Greenfield & Sacks, P.C.

(57) ABSTRACT

An organic photodetector comprising an anode (103), a cathode (107) and a layer (105) comprising an organic electron donor and an organic electron acceptor between the anode and the cathode wherein the weight of the organic electron acceptor is less than 2 times that of the electron donor. The organic electron acceptor may be a fullerene. The organic electron donor may be a conjugated polymer.

14 Claims, 2 Drawing Sheets

(56) References Cited

FOREIGN PATENT DOCUMENTS

WO     WO 2016/037678 A1     3/2016
WO     WO 2016/078744 A1     5/2016

OTHER PUBLICATIONS

GB1616300.8, Mar. 28, 2017, Combined Search and Examination Report.
International Search Report and Written Opinion for International Application No. PCT/GB2017/052856, dated Dec. 1, 2017.
Combined Search and Examination Report for British Application No. GB1616300.8, dated Mar. 28, 2017.

ORGANIC PHOTODETECTOR

RELATED APPLICATIONS

This Application is a national stage filing under 35 U.S.C. § 371 of international PCT application PCT/GB2017/052856, filed Sep. 25, 2017, which claims priority to United Kingdom patent application no. GB 1616300.8, filed Sep. 26, 2016, each of which is incorporated herein by reference in its entirety.

FIELD OF THE INVENTION

The present invention relates to electron acceptor/electron donor compositions and organic photodetectors comprising said compositions.

BACKGROUND OF THE INVENTION

A range of organic electronic devices comprising organic semiconductor materials are known including organic light-emitting devices, organic field effect transistors, organic photovoltaic devices and organic photodetectors (OPDs).

OPDs comprise an electron acceptor and an electron donor between two electrodes. US 2003/066950 discloses a photoresponsive device comprising a blend of semiconductive polymers.

US 2012/0205596 discloses a macromolecular compound of formula (I) and use thereof in photovoltaic devices and organic transistors:

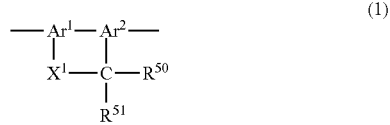

wherein Ar1 and Ar2 are a trivalent heterocyclic group; $X^1$ represents —O—, —S—, —C(=O)—, —S(=O)—, —SO$_2$—, Si(R$^3$)(R$^4$)—, —N(R$^5$)—, —B(R$^6$)—, P(R$^7$)— or —P(=O)(R$^8$)— wherein R$^4$, R$^5$, R$^6$, R$^7$, R$^8$, R$^{50}$ and R$^{51}$ may be certain substituents.

A drawback with OPDs is the presence of dark current, i.e. current flowing through the device in the absence of any photons incident on the device, which may affect the limit of detection of the device.

It is therefore an object of the invention to provide an OPD having low dark current.

It is a further object of the invention to provide an OPD having low dark current and good external quantum efficiency.

SUMMARY OF THE INVENTION

The present inventors have found that dark current in OPDs may be reduced at specific electron acceptor:electron donor ratios.

Accordingly, in a first aspect the invention provides an organic photodetector comprising an anode, a cathode and a layer comprising an organic electron donor and an organic electron acceptor between the anode and the cathode wherein the weight of the organic electron acceptor is less than 2 times that of the electron donor.

DESCRIPTION OF THE DRAWINGS

The invention will now be described in more detail with reference to the drawings in which.

DETAILED DESCRIPTION OF THE INVENTION

Figure 1:
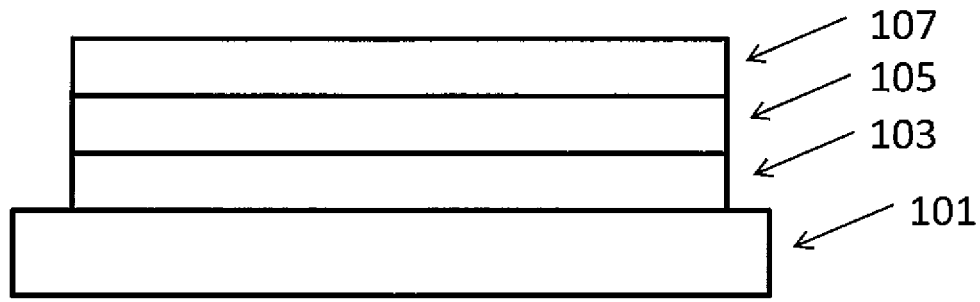
FIG. 1 illustrates an organic photodetector according to an embodiment of the invention.

FIG. 1 illustrates an OPD according to an embodiment of the invention. The OPD comprises a cathode 103 supported by a substrate 101, an anode 107 and a bulk heterojunction layer 105 between the anode and the cathode comprising a mixture of an electron acceptor and an electron donor. Optionally, the bulk heterojunction layer consists of the electron acceptor and electron donor.

The bulk heterojunction layer optionally has a thickness in the range of about 10 nm to 3 µm, more preferably from 20 nm to 2 µm.

One or more further layers may be provided between the anode and the cathode. A hole-transporting layer may be provided between the anode and the bulk heterojunction layer. An electron-transporting layer may be provided between the cathode and the bulk heterojunction layer.

The anode 103 and the cathode 107 are connected to circuitry which may include a voltage source for applying a reverse bias to the device and a detector (e.g. current meter or readout device, wired in series with the reverse bias voltage source, as detection circuit), for example, to measure the generated photocurrent. Conversion of light incident on the bulk heterojunction layer into electrical current may be detected in reverse bias mode.

The weight of the organic electron acceptor is less than 2 times that of the electron donor.

Preferably, the weight of the organic electron acceptor is no more than 1.8 times that of the electron donor.

Preferably, the weight of the organic electron acceptor is at least the same as that of the electron donor.

Preferably, the weight of the organic electron acceptor is in the range of 1.5-1.7 times that of the electron donor.

The electron donor material has a LUMO that is shallower than the LUMO of the electron acceptor material. Optionally, the gap between the LUMO acceptor and the LUMO donor is at least 0.1 eV.

Optionally, the electron donor material has a LUMO of up to 3.5 eV from vacuum level, optionally 3.0-3.5 eV from vacuum level.

Optionally, the electron donor material has a HOMO level of no more than 5.5 eV from vacuum level.

Optionally, the electron acceptor material has a LUMO level more than 3.5 eV from vacuum level, optionally 3.6-4.0 eV from vacuum level.

HOMO and LUMO levels as described herein are as measured by square wave voltammetry.

It will be understood that the electron donor may be a single electron donor material or a mixture of two or more electron donor materials, and the electron acceptor may consist of a single electron acceptor material or may be a mixture of two or more electron acceptor materials.

The electron acceptor and the electron donor may each independently be a polymeric material or a non-polymeric material.

Preferably, the electron donor is a polymer. Electron donor polymers are optionally selected from conjugated hydrocarbon or heterocyclic polymers including polyacene, polyaniline, polyazulene, polybenzofuran, polyfluorene, polyfuran, polyindenofluorene, polyindole, polyphenylene, polypyrazoline, polypyrene, polypyridazine, polypyridine, polytriarylamine, poly(phenylene vinylene), poly(3-substituted thiophene), poly(3,4-bisubstituted thiophene), polyselenophene, poly(3-substituted selenophene), poly(3,4-bisubstituted selenophene), poly(bisthiophene), poly(terthiophene), poly(bisselenophene), poly(terselenophene), polythieno[2,3-b]thiophene, polythieno[3,2-b]thiophene, polybenzothiophene, polybenzo[1,2-b: 4,5-b']dithiophene, polyisothianaphthene, poly(monosubstituted pyrrole), poly(3,4-bisubstituted pyrrole), poly-1,3,4-oxadiazoles, polyisothianaphthene, derivatives and co-polymers thereof. Preferred examples electron-donor polymers are copolymers of polyfluorenes and polythiophenes, each of which may be substituted, and polymers comprising benzothiadiazole-based and thiophene-based repeating units, each of which may be substituted. The electron donor preferably comprises a repeat unit of formula (I):

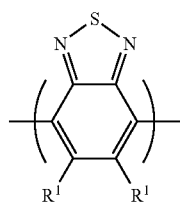

(I)

wherein $R^1$ in each occurrence is independently H or a substituent.

Optionally, each $R^1$ is independently selected from the group consisting of:

$C_{1-20}$ alkyl wherein one or more non-adjacent, non-terminal carbon atoms of the alkyl group may be replaced with O, S or C=O and wherein one or more H atoms of the $C_{1-20}$ alkyl may be replaced with F; an aryl or heteroaryl group, preferably phenyl, which may be unsubstituted or substituted with one or more substituents; and fluorine.

Substituents of an aryl or heteroaryl group are optionally selected from F, CN, $NO_2$ and $C_{1-20}$ alkyl wherein one or more non-adjacent, non-terminal carbon atoms of the alkyl group may be replaced with O, S or C=O.

By "non-terminal" as used herein is meant a carbon atom other than the methyl group of a linear alkyl (n-alkyl) chain and the methyl groups of a branched alkyl chain.

A polymer comprising a repeat unit of formula (I) is preferably a copolymer comprising one or more co-repeat units.

The one or more co-repeat units may comprise or consist of one or more of $C_{6-20}$ monocyclic or polycyclic arylene repeat units which may be unsubstituted or substituted with one or more substituents; 5-20 membered monocyclic or polycyclic heteroarylene repeat units which may be unsubstituted or substituted with one or more substituents.

The one or more co-repeat units may have formula (II):

(II)

wherein $Ar^1$ in each occurrence is an arylene group or a heteroarylene group; m is at least 1; $R^2$ is a substituent; $R^2$ in each occurrence is independently a substituent; n is 0 or a positive integer; and two groups $R^2$ may be linked to form a ring.

Optionally, each $R^2$ is independently selected from the group consisting of a linear, branched or cyclic $C_{1-20}$ alkyl wherein one or more non-adjacent, non-terminal C atoms of the $C_{1-20}$ alkyl may be replaced with O, S, COO or CO.

Two groups $R^2$ may be linked to form a $C_{1-10}$ alkylene group wherein one or more non-adjacent C atoms of the alkylene group may be replaced with O, S, COO or CO.

Optionally, m is 2.

Optionally, each $Ar^1$ is independently a 5 or 6 membered heteroarylene group, optionally a heteroarylene group selected from the group consisting of thiophene, furan, selenophene, pyrrole, diazole, triazole, pyridine, diazine and triazine, preferably thiophene.

Optionally, the repeat unit of formula (II) has formula (IIa):

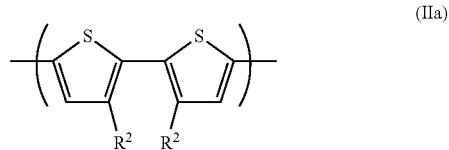

(IIa)

Optionally, the groups $R^2$ are linked to form a 2-5 membered bridging group. Optionally, the bridging group has formula —O—C($R^{16}$)$_2$— wherein $R^{16}$ in each occurrence is independently H or a substituent. Substituents $R^{16}$ are optionally selected from $C_{1-20}$ alkyl. Preferably each $R^{16}$ is H.

An electron-accepting polymer or an electron-donating polymer as described herein may have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of the polymers described herein may be $1\times10^3$ to $1\times10^8$, and preferably $1\times10^4$ to $1\times10^7$ Preferably, the electron acceptor is a non-polymeric compound, more preferably a fullerene.

The fullerene may be a $C_{60}$, $C_{70}$, $C_{76}$, $C_{78}$ and $C_{84}$ fullerene or a derivative thereof including, without limitation, PCBM-type fullerene derivatives (including phenyl-C61-butyric acid methyl ester ($C_{60}$PCBM), TCBM-type fullerene derivatives (e.g. tolyl-C61-butyric acid methyl ester ($C_{60}$TCBM)), and ThCBM-type fullerene derivatives (e.g. thienyl-C61-butyric acid methyl ester ($C_{60}$ThCBM).

Fullerene derivatives may have formula (III):

(III)

wherein A, together with the C—C group of the fullerene, forms a monocyclic or fused ring group which may be unsubstituted or substituted with one or more substituents.

Exemplary fullerene derivatives include formulae (IIIa), (IIIb) and (IIIc):

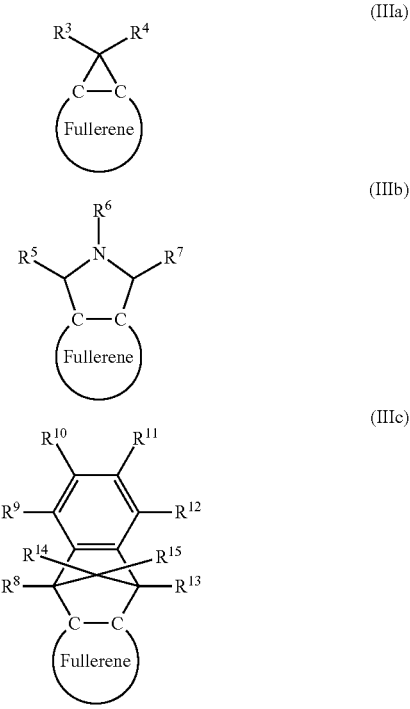

wherein $R^3$-$R^{15}$ are each independently H or a substituent.

Substituents $R^3$-$R^{15}$ are optionally and independently in each occurrence selected from the group consisting of aryl or heteroaryl, optionally phenyl, which may be unsubstituted or substituted with one or more substituents; and $C_{1-20}$ alkyl wherein one or more non-adjacent, non-terminal C atoms may be replaced with O, S, CO or COO and one or more H atoms may be replaced with F.

Substituents of aryl or heteroaryl, where present, are optionally selected from $C_{1-12}$ alkyl wherein one or more non-adjacent, non-terminal C atoms may be replaced with O, S, CO or COO and one or more H atoms may be replaced with F.

At least one of the first and second electrodes is transparent so that light incident on the device may reach the bulk heterojunction layer.

The or each transparent electrode preferably has a transmittance of at least 70%, optionally at least 80%, to wavelengths in the range of 400-900 nm.

Preferably, one electrode is transparent and the other electrode is reflective.

Optionally, the transparent electrode comprises a layer of transparent conducting oxide, preferably indium tin oxide or indium zinc oxide.

Optionally, the reflective electrode comprises a layer of a reflective metal, optionally aluminium or silver.

The device may be formed by forming the bulk heterojunction layer over one of the anode and cathode supported by a substrate and depositing the other of the anode or cathode over the bulk heterojunction layer.

The substrate may be, without limitation, a glass or plastic substrate. The substrate is transparent if, in use, incident light is to be transmitted through the substrate and the electrode supported by the substrate.

The substrate supporting one of the anode and cathode may or may not be transparent if, in use, incident light is to be transmitted through the other of the anode and cathode.

The bulk heterojunction layer may be formed by any process including, without limitation, thermal evaporation and solution deposition methods.

Preferably, the bulk heterojunction layer is formed by depositing a formulation comprising the acceptor material and the electron donor material dissolved or dispersed in a solvent or a mixture of two or more solvents. The formulation may be deposited by any coating or printing method including, without limitation, spin-coating, dip-coating, roll-coating, spray coating, doctor blade coating, wire bar coating, slit coating, ink jet printing, screen printing, gravure printing and flexographic printing.

The one or more solvents of the formulation may optionally comprise or consist of benzene substituted with one or more substituents selected from chlorine, $C_{1-10}$ alkyl and $C_{1-10}$ alkoxy wherein two or more substituents may be linked to form a ring which may be unsubstituted or substituted with one or more $C_{1-6}$ alkyl groups, optionally toluene, xylenes, trimethylbenzenes, tetramethylbenzenes, anisole, indane and its alkyl-substituted derivatives, and tetralin and its alkyl-substituted derivatives.

The formulation may comprise a mixture of two or more solvents, preferably a mixture comprising at least one benzene substituted with one or more substituents as described above and one or more further solvents. The one or more further solvents may be selected from esters, optionally alkyl or aryl esters of alkyl or aryl carboxylic acids, optionally a $C_{1-10}$ alkyl benzoate or benzyl benzoate.

The formulation may comprise further components in addition to the electron acceptor, the electron donor and the one or more solvents. As examples of such components, adhesive agents, defoaming agents, deaerators, viscosity enhancers, diluents, auxiliaries, flow improvers colourants, dyes or pigments, sensitizers, stabilizers, nanoparticles, surface-active compounds, lubricating agents, wetting agents, dispersing agents and inhibitors may be mentioned.

The organic photodetector as described herein may be used in a wide range of applications including, without limitation, detecting the presence and/or brightness of ambient light and in a sensor comprising the organic photodetector and a light source. The photodetector may be configured such that light emitted from the light source is incident on the photodetector and changes in wavelength and/or brightness of the light may be detected. The sensor may be, without limitation, a gas sensor, a biosensor, an X-ray imaging device, a motion sensor (for example for use in security applications) a proximity sensor or a fingerprint sensor.

Examples

Devices having the following structure were prepared:

Cathode/Donor: Acceptor layer/Hole-transport layer/Anode

A glass substrate coated with silver and a layer of indium-tin oxide (ITO) was treated with polyethyleneimine (PEIE) to modify the work function of the ITO.

A layer of a mixture of Donor Polymer 1 and Fullerene Acceptor 1, illustrated below, was deposited over the modified ITO layer by spin-coating from 1,2,4-trimethylbenzene:benzyl benzoate in a ratio as set out in Table 1.

A hole-transporting layer available from Solvay, Inc. was formed over the donor/acceptor mixture layer by spin-coating.

An anode of silver nanowires was formed over the hole-transporting layer by spin-coating.

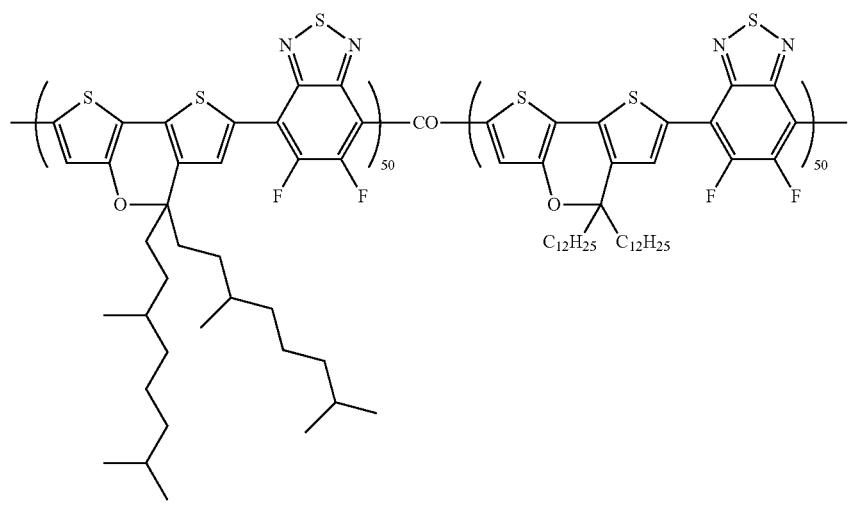

Donor Polymer 1

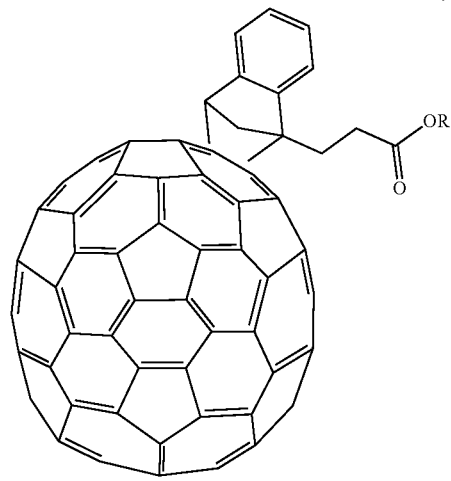

Fullerene Acceptor 1

R is hexyl or butyl.

TABLE 1

| Device | Donor Polymer 1:Acceptor Fullerene 1 (wt) |
|---|---|
| Comparative Device 1 | 1:2.2 |
| Comparative Device 2 | 1:2 |
| Device Example 1 | 1:1.7 |
| Device Example 2 | 1:1.5 |

The devices were operated in reverse bias.

Figure 2:
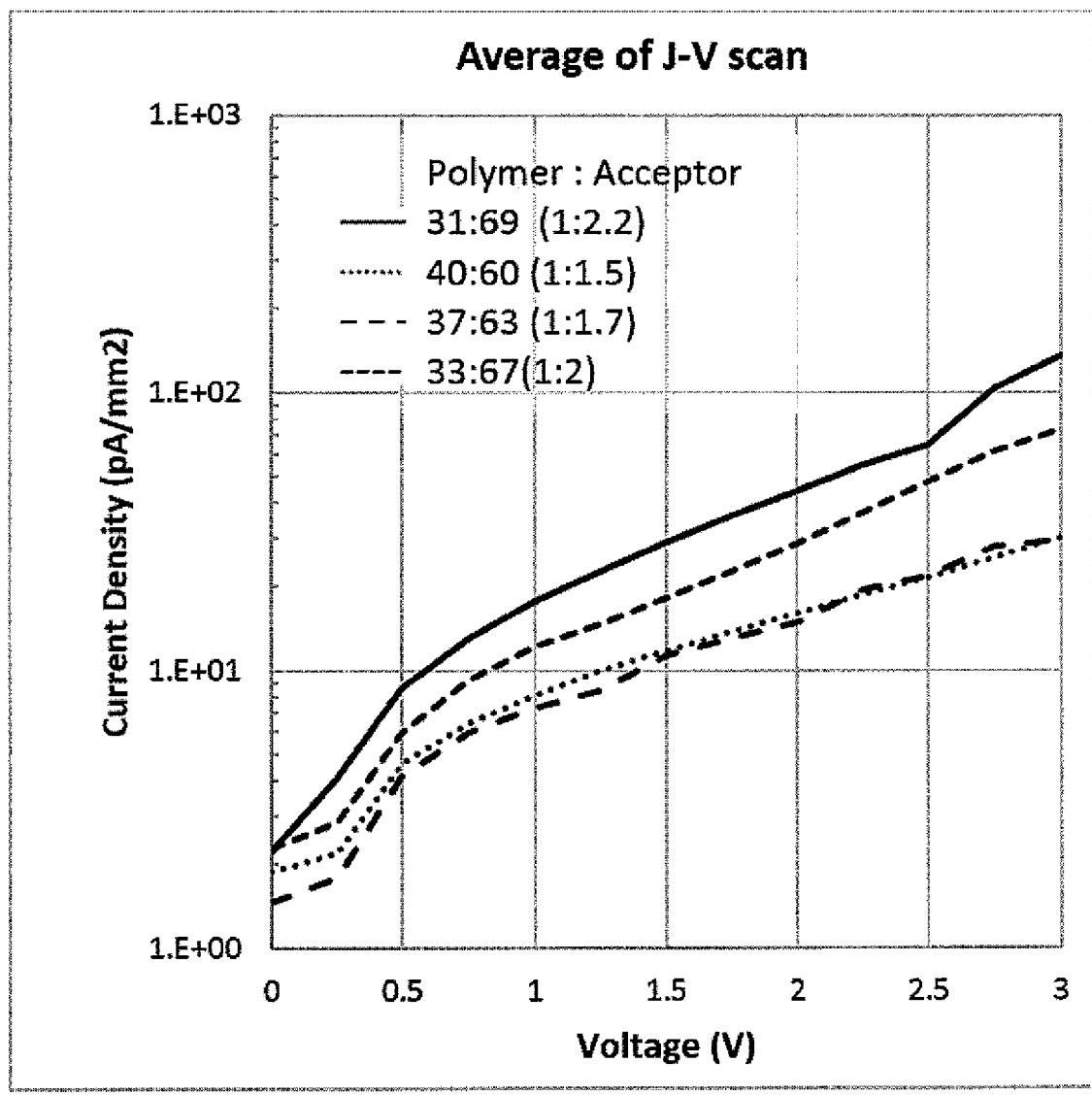
FIG. 2 is a graph of current density vs. voltage for organic photodetectors having varying electron donor and electron acceptor ratios.

With reference to FIG. 2, it can be seen that dark current is considerably higher for Comparative Devices 1 and 2 as compared to Device Examples 1 and 2.

Figure 3:
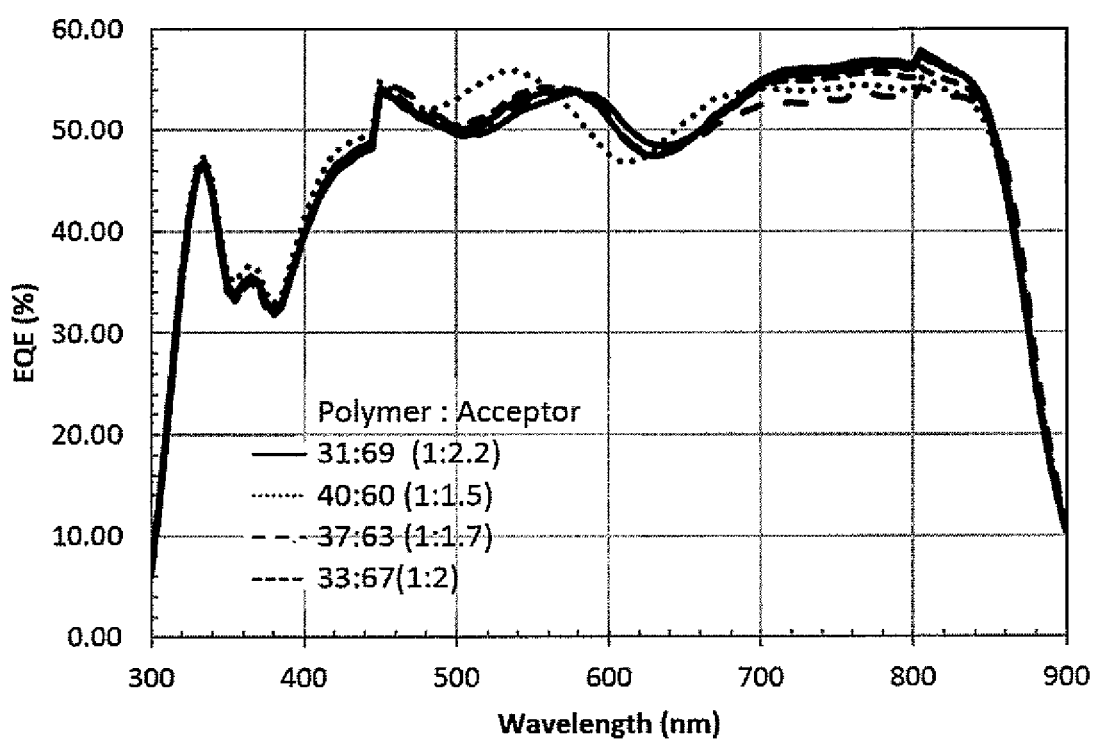
FIG. 3 is a graph of external quantum efficiency vs. voltage for organic photodetectors having varying electron donor and electron acceptor ratios.

External quantum efficiencies (EQE) of the devices were measured in reverse bias (2V). With reference to FIG. 3, the EQEs of all devices are substantially the same.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. An organic photodetector comprising an anode, a cathode and a layer comprising an organic electron donor and an organic electron acceptor between the anode and the cathode wherein the weight of the organic electron acceptor is less than 2 times that of the electron donor and the electron donor is a conjugated polymer comprising a repeat unit of formula (IIa):

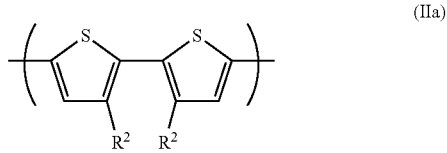

wherein the groups $R^2$ are linked to form a bridging group of formula —O—C$(R^{16})_2$—, wherein $R^{16}$ in each occurrence is independently selected from: H; and $C_{1-20}$ alkyl.

2. An organic photodetector according to claim 1 wherein the weight of the organic electron acceptor is no more than 1.8 times that of the electron donor.

3. An organic photodetector according to claim 1 wherein the weight of the organic electron acceptor is at least the same as that of the electron donor.

4. An organic photodetector according to claim 1 wherein the electron acceptor is a fullerene or a derivative thereof.

5. An organic photodetector according to claim 4 wherein the electron acceptor is a fullerene derivative of formula (III):

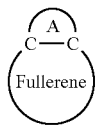

(III)

wherein A, together with the C—C group of the fullerene, forms a monocyclic or fused ring group which may be unsubstituted or substituted with one or more substituents.

6. An organic photodetector according to claim 5 wherein the fullerene derivative of formula (III) is selected from formulae (IIIa), (IIIb) and (IIIc):

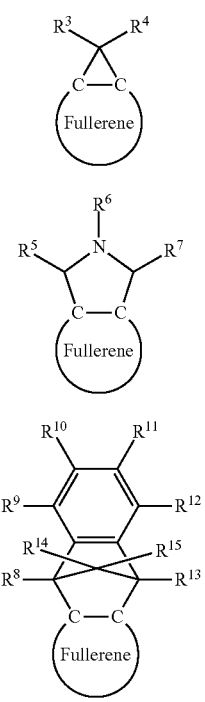

wherein $R^3$-$R^{15}$ are each independently H or a substituent.

7. An organic photodetector according to claim 1, wherein the polymer comprises a repeat unit of formula (I):

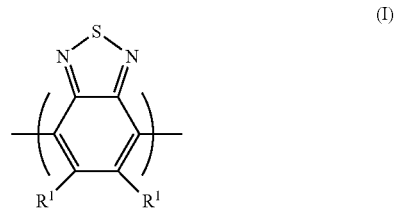

(I)

wherein $R^1$ in each occurrence is independently H or a substituent.

8. An organic photodetector according to claim 1 wherein the polymer is a copolymer comprising two or more different repeat units.

9. An organic photodetector according to claim 1 wherein a hole-transporting layer is provided between the anode and the layer comprising the organic electron donor and an organic electron acceptor.

10. An organic photodetector according to claim 1 wherein the organic photodetector is connected to circuitry for application of reverse bias.

11. An organic photodetector according to claim 10 wherein the circuitry comprises a detector for measuring photocurrent of the device.

12. A method of forming an organic photodetector according to claim 1, the method comprising:
  applying a formulation comprising the organic electron donor and an organic electron acceptor dissolved in a solvent or solvent mixture over one of the anode and cathode to form a wet film;
  drying the wet film to provide the layer comprising the organic electron donor and an organic electron acceptor; and
  forming the other of the anode and cathode over the layer comprising the organic electron donor and an organic electron acceptor.

13. A sensor comprising a light source and an organic photodetector according to claim 1.

14. A method of detecting light comprising measurement of photocurrent generated by light incident on an organic photodetector according to claim 1.

* * * * *